(12) United States Patent
Nakamura

(10) Patent No.: US 7,390,702 B2
(45) Date of Patent: Jun. 24, 2008

(54) METHOD FOR MANUFACTURING SEMICONDUCTOR DEVICE

(75) Inventor: Toshiyuki Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 313 days.

(21) Appl. No.: 11/118,361

(22) Filed: May 2, 2005

(65) Prior Publication Data

US 2006/0068534 A1 Mar. 30, 2006

(30) Foreign Application Priority Data

Sep. 30, 2004 (JP) ............................. 2004-287634

(51) Int. Cl.
*H01L 21/00* (2006.01)
(52) U.S. Cl. ................. 438/151; 438/700; 257/E21.704
(58) Field of Classification Search ................. 438/151, 438/700; 257/E21.704
See application file for complete search history.

(56) References Cited

U.S. PATENT DOCUMENTS

| 6,185,308 | B1 * | 2/2001 | Ando et al. ................. 380/286 |
| 6,348,991 | B1 * | 2/2002 | Smith et al. ................. 359/321 |
| 6,815,308 | B2 * | 11/2004 | Holscher et al. ............ 438/401 |
| 7,129,114 | B2 * | 10/2006 | Akram ........................ 438/110 |
| 2001/0038153 | A1 | 11/2001 | Sakaguchi |
| 2003/0038383 | A1 | 2/2003 | Sakaguchi |
| 2005/0099532 | A1 * | 5/2005 | Tseng ......................... 348/374 |
| 2005/0202651 | A1 * | 9/2005 | Akram ........................ 438/463 |
| 2006/0043569 | A1 * | 3/2006 | Benson et al. ............... 257/698 |

FOREIGN PATENT DOCUMENTS

| JP | 5235006 | 9/1993 |
| JP | 837137 | 2/1996 |
| JP | 2000294467 | 10/2000 |
| JP | 2001257139 | 9/2001 |

* cited by examiner

*Primary Examiner*—Michael S. Lebentritt
*Assistant Examiner*—Stanetta D Isaac
(74) *Attorney, Agent, or Firm*—Volentine & Whitt, P.L.L.C.

(57) ABSTRACT

Laser is applied onto part on an SOS substrate using a sapphire layer to form an identifying mark. The sapphire layer on the surface of the SOS substrate, which has been exposed upon laser application, is covered with an insulating film formed by heat treatment at 700° C. or less, and thereafter a device is formed using heat treatment at a temperature higher than 700° C.

9 Claims, 1 Drawing Sheet

METHOD FOR MANUFACTURING SEMICONDUCTOR DEVICE

BACKGROUND OF THE INVENTION

1. Field of the Invention

The present invention relates to a method for forming a wafer identifying mark in a manufacturing process of a semiconductor integrated circuit, and particularly to a method for forming an identifying mark on an SOS substrate using sapphire in a manufacturing process of a semiconductor integrated circuit.

2. Description of the Related Art

Since it is possible to reduce a parasitic capacitance between an elemental device such as a transistor and a substrate and decrease a current that leaks from the elemental device such as the transistor to the substrate, it is generally advantageous to fabricate a device satisfactory in high-frequency characteristic, a low power consumption device and the like on a wafer high in insulating property. As the substrate, for example, a silicon-on-insulator (SOI) substrate has been used which has a structure wherein a silicon oxide film ($SiO_2$) is interposed between a silicon (Si) substrate and a silicon layer in a device production area.

Further, as a substrate that uses the above features to the full, there is considered a substrate wherein a silicon layer in a device production area is formed on an insulating layer. As the substrate having such a structure, may be mentioned, a silicon-on-sapphire (SOS) substrate in which a silicon layer in a device production area is formed on a sapphire substrate. The technology of manufacturing a device on the SOS substrate has also started with commercialization.

Comparing a process technology for fabricating a device on an SOI substrate and that for fabricating a device on a bulk silicon substrate currently in vogue, a large difference does not occur therebetween. Thus, an apparatus or the like used in a bulk silicon process can be diverted as it is. It can be said from this point of view that the bulk silicon process and the SOS process can also be carried out simultaneously with the same production lines shared therebetween.

However, a sapphire crystal constituting the SOS substrate is aluminum oxide ($Al_2O_3$). When a device is fabricated in a state in which sapphire is being bare, a small amount of aluminum (Al) is adhered to a portion where the sapphire and the apparatus are brought into contact with each other. There is a fear that a phenomenon such as adhesion of aluminum to the apparatus, that aluminum is dissociated from the sapphire during heat treatment at a high temperature and floats in the apparatus, will occur.

It has been known that when such aluminum is captured or taken in a transistor in the course of its manufacture, it leads to degradation of device characteristics. There is a need to make such a contrivance that aluminum is not taken in a device fabricated on the same SOS substrate and devices on other bulk silicon substrate and the SOI substrate both of which share production lines therebetween. Even in the sense of avoidance of such a problem, the SOS substrate is constructed in a state in which a portion other than a silicon layer in a device production area is perfectly covered with a silicon nitride film ($Si_3N_4$) or the like, and no sapphire is bared. This method has been used as an out diffusion measure (refer to Japanese Unexamined Patent Publication No. Hei 5(1993)-235006).

When the devices are fabricated on the production lines by use of the SOS substrate, bulk silicon substrate and SOI substrate each having such a construction as described above, some contrivance to identify the background of each substrate, such as a history of process operations, generally, marking of a substrate placed immediately before its introduction into production lines with a wafer identifying mark or the like such as alphameric characters by laser has been carried out (Japanese Unexamined Patent Publication No. Hei 8(1996)-37137, No. 2000-294467 and No. 2001-257139).

However, when the SOS substrate is laser-marked with the wafer identifying mark, the wafer identifying mark is formed in a form that the silicon nitride film or the like for covering up the silicon layer and sapphire in the device production area is burned out. At this time, laser reaches a sapphire layer after the silicon nitride film or the like for covering up the silicon layer and the sapphire in the device production area has been molten and removed.

Therefore, the sapphire is bared at the portion where the wafer identifying mark is formed, thus causing a fear that aluminum will be dissociated during heat treatment at a high temperature in process. In particular, a problem arises in that since a sapphire crystal is damaged by laser, aluminum in the sapphire crystal becomes easy to cause out diffusion.

SUMMARY OF THE INVENTION

The present invention has been made in view of the foregoing. It is therefore an object of the present invention to provide a method for manufacturing a semiconductor device.

In order to attain the above object, there is provided a method for forming a semiconductor device, according to the present invention, wherein laser is applied onto part of an SOS substrate comprising a sapphire layer to provide marking, the exposed sapphire layer on the surface of the SOS substrate is covered with an insulating film formed by heat treatment at 700° C. or less, and thereafter heat treatment at a temperature higher than 700° C. is performed.

Since the exposed sapphire layer is covered with the insulating film formed by heat treatment at 700° C. or less, an aluminum impurity is not out-diffused from the sapphire layer even if heat treatment at a temperature higher than 700° C. is thereafter effected, thereby making it possible to form a high reliable semiconductor device.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

The present invention will hereinafter be described with reference to the accompanying figures.

Figure 1:
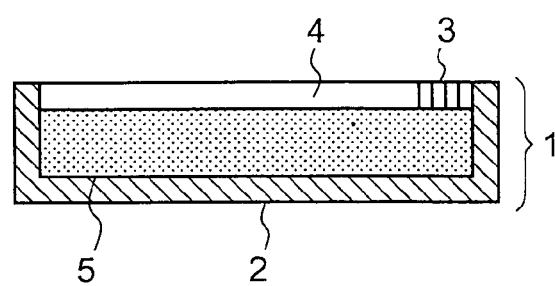
FIG. 1 is a process sectional view and a plan view showing a method for manufacturing a semiconductor device, which is used for describing an embodiment of the present invention.
Figure 1:
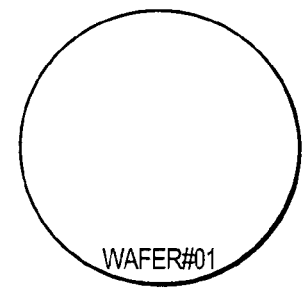

In order to prevent baring of sapphire at a wafer identifying mark section, there is a need to cover the wafer identifying mark section with a film or the like free of worry about impurity contamination again. A method therefor will be shown using wafer sectional views and wafer plan views. As shown in FIG. 1, a silicon nitride film 2 corresponding to a protective film is first formed at a portion excluding an upper surface of an SOS substrate 1. Thereafter, a wafer identifying mark 3 is formed using laser. Thus, a silicon layer 4 provided on the surface of the SOS substrate is cut away so that a section or portion at which a sapphire layer 5 is bared, appears.

Figure 2:
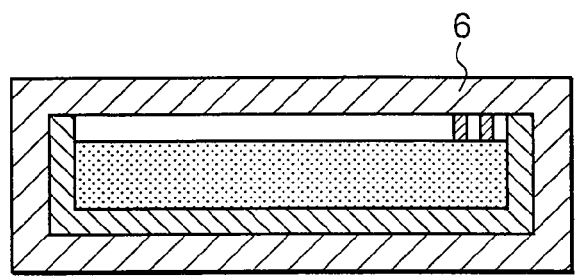
FIG. 2 is a process sectional view and a plan view following FIG. 1, showing the method for manufacturing the semiconductor device, which is used for describing the embodiment of the present invention.
Figure 2:
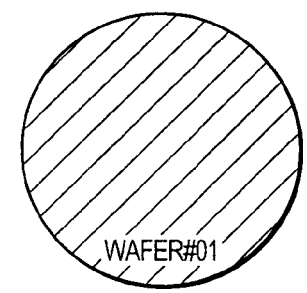

Next, as shown in FIG. 2, a silicon oxide film 6 is formed on the surface or entirety of the SOS substrate 1 by, for example, an LPCVD method. The silicon oxide film 6 is sufficient with 5 nm or so in thickness. The silicon oxide film 6 may be an insulating film such as a silicon nitride film. Since the SOS substrate 1 is covered with the silicon nitride film 2 in advance even though a wafer is brought into contact with a silicon oxide film forming apparatus at the silicon oxide film forming apparatus, there is no fear that aluminum is adhered to the apparatus so that the apparatus is contaminated.

The fact that the melting point of sapphire is 2040° C. and aluminum in a sapphire crystal is dissociated, is considered to be impossible in the process technology of a normal silicon semiconductor in the neighborhood of 100020 C. even at the highest temperature. It is however confirmed that when the exposed sapphire layer is heat-treated in the neighborhood of 1000° C., aluminum is brought to out diffusion. It has been confirmed by experiments that heat or thermal treatment at at least 700° C. or less is required to prevent the out diffusion. Therefore, the temperature for the formation of the silicon oxide film 6 needs to be 700° C. or less.

With the formation of the silicon oxide film 6, the subsequent heat treatment does not cause the problem of the out diffusion of aluminum even at a high temperature greater than 700° C. Since the thickness of the silicon oxide film 6 formed at this time is partly removed in a process step such as cleaning using hydrofluoric acid, which is carried out during a device fabricating process, there is a need to form a thickness in which a partial reduction in the thickness has been taken into consideration. It is generally necessary to form a silicon oxide film of 300 nm or more at minimum.

Figure 3:
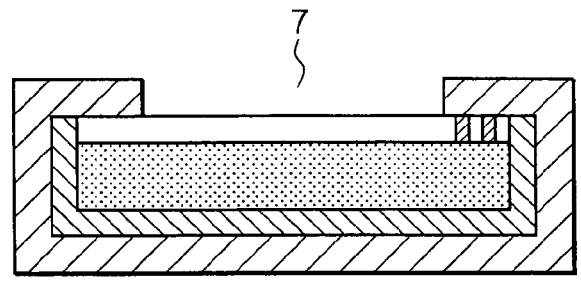
FIG. 3 is a process sectional view and a plan view following FIG. 2, showing the method for manufacturing the semiconductor device, which is used for describing the embodiment of the present invention.
Figure 3:
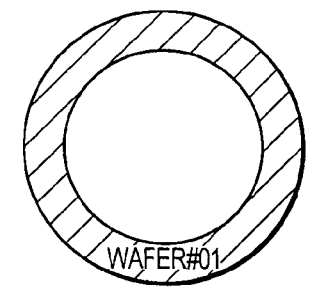

Next, as shown in FIG. 3, an aperture or opening 7 is defined in part of the silicon layer 4 by the known photolithography technology. Then, the silicon oxide film 6 at the opening 7 is etched so as to cause the silicon oxide film 6 to remain only in the portion corresponding to the wafer identifying mark 3. Thereafter, a device is formed through the known device fabricating process (not shown).

According to the present embodiment as described above, the covering of a sapphire layer exposed due to the formation of a wafer identifying mark with a silicon oxide film makes it possible to prevent dissociation or the like of aluminum and prevent danger of aluminum corresponding to an impurity portion being taken or captured in a transistor. A silicon nitride film or a laminated film or the like corresponding to an insulating film other than the silicon oxide film is also capable of obtaining similar effects.

The present invention is capable of preventing out diffusion from a laser-marked identifying mark at the formation of a semiconductor device using an SOS substrate and forming a high reliable SOS device.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A method for forming a semiconductor device, comprising:
    forming at least one trench in a silicon layer of an SOS substrate using a laser, wherein the SOS substrate comprises the silicon layer and a sapphire layer, and a portion of the sapphire layer forms a bottom surface of the at least one trench;
    forming an insulating film that covers the at least one trench at a temperature less than or equal to 700° C.; and
    thereafter performing thermal treatment at a temperature higher than 700° C.

2. The method according to claim 1, wherein the trench is an identifying mark.

3. The method according to claim 2, wherein the insulating film is a CVD silicon oxide film.

4. The method according to claim 2, wherein the insulating film is a CVD silicon nitride film.

5. The method according to claim 2, wherein the insulating film is a laminated film.

6. A method for forming a semiconductor device, comprising:
    etching part of a silicon layer of an SOS substrate to form a trench, wherein the SOS substrate comprises the silicon layer and a sapphire layer, and a portion of the sapphire layer forms a bottom surface of the trench;
    heat-treating the surface of the sapphire layer at 700° C. or less to form an insulating film; and
    thereafter performing heat treatment at a temperature higher than 700° C.

7. The method according to claim 6, wherein the insulating film is a CVD silicon oxide film.

8. The method according to claim 6, wherein the insulating film is a CVD silicon nitride film.

9. The method according to claim 6, wherein the insulating film is a laminated film.

* * * * *